(12) United States Patent
Lee

(10) Patent No.: US 11,678,431 B2
(45) Date of Patent: Jun. 13, 2023

(54) CIRCUIT BOARD HAVING WAVEGUIDES AND METHOD OF MANUFACTURING THE SAME

(71) Applicant: BOARDTEK ELECTRONICS CORPORATION, Taoyuan (TW)

(72) Inventor: Chien-Cheng Lee, New Taipei (TW)

(73) Assignee: BOARDTEK ELECTRONICS CORPORATION, Taoyuan (TW)

( * ) Notice: Subject to any disclaimer, the term of this patent is extended or adjusted under 35 U.S.C. 154(b) by 186 days.

(21) Appl. No.: 17/376,406

(22) Filed: Jul. 15, 2021

(65) Prior Publication Data
US 2023/0011064 A1 Jan. 12, 2023

(30) Foreign Application Priority Data
Jul. 7, 2021 (TW) ................................. 110125048

(51) Int. Cl.
*H01P 3/12* (2006.01)
*H05K 1/02* (2006.01)
*H01P 11/00* (2006.01)

(52) U.S. Cl.
CPC ............. *H05K 1/024* (2013.01); *H01P 3/121* (2013.01); *H01P 11/002* (2013.01); *H05K 2201/037* (2013.01)

(58) Field of Classification Search
CPC ...... H01P 3/121; H01P 11/003; H01P 11/002; H01P 11/005; H01P 11/006
See application file for complete search history.

(56) References Cited

U.S. PATENT DOCUMENTS

| 6,101,705 A | * | 8/2000 | Wolfson | ................ H01P 11/002 29/600 |
| 2004/0056739 A1 | * | 3/2004 | Inuzuka | ................ H01P 11/002 333/239 |

* cited by examiner

*Primary Examiner* — Jeremy C Norris
(74) *Attorney, Agent, or Firm* — ScienBiziP, P.C.

(57) ABSTRACT

A method of manufacturing a circuit board having waveguides including forming a waveguiding structure by injection molding. The waveguiding structure includes a plurality of waveguides arranged at intervals and at least one connecting portion connecting two adjacent waveguides. Each waveguide includes a waveguiding substrate and at least one protrusion on the waveguiding substrate. The connecting portion is removed to obtain at least two waveguides. A metal layer is formed to wrap the whole outer surface of each waveguide. A plurality of receiving grooves is formed to penetrate a wiring board. Each waveguide wrapped by the metal layer is embedded in one of the receiving grooves. The waveguides and the wiring board are fixed. A portion of the metal layer on a surface of each protrusion facing away from the waveguiding substrate is removed. A circuit board is also provided.

14 Claims, 12 Drawing Sheets

CIRCUIT BOARD HAVING WAVEGUIDES AND METHOD OF MANUFACTURING THE SAME

FIELD

The subject matter herein generally relates to a field of waveguides, especially relates to a circuit board having waveguides and a method of manufacturing the circuit board having waveguides.

BACKGROUND

With the continuous improvement of PCB transmission frequency, the traditional copper wire connection will reach the performance threshold. The rectangular waveguide used in the early microwave field has the advantages of small loss, large bandwidth, and high transmission rate. If the rectangular waveguide is integrated into high frequency PCB, it will be able to meet the needs of the development of microwave integrated circuits.

Substrate Integrated Waveguide (shorted as SIW) is a new type of transmission line structure that can be integrated into a dielectric substrate. SIW is usually obtained by drilling two rows of metal through holes on a dielectric substrate covered with metal on opposite sides of the substrate. Under the condition of ensuring that the energy on the transmission line does not leak, the metal through holes are equivalent to a metal wall, and the transmission characteristics can be similar to a rectangular waveguide. However, the number of metal through holes in the preparation of the substrate integrated waveguide in the prior art is often very large and the accuracy requirements are high, which is not conducive to the reduction of cost and the improvement of product yield.

Therefore, there is room for improvement within the art.

BRIEF DESCRIPTION OF THE DRAWINGS

Implementations of the present disclosure will now be described, by way of embodiments, with reference to the attached figures.

DETAILED DESCRIPTION

Figure 1:
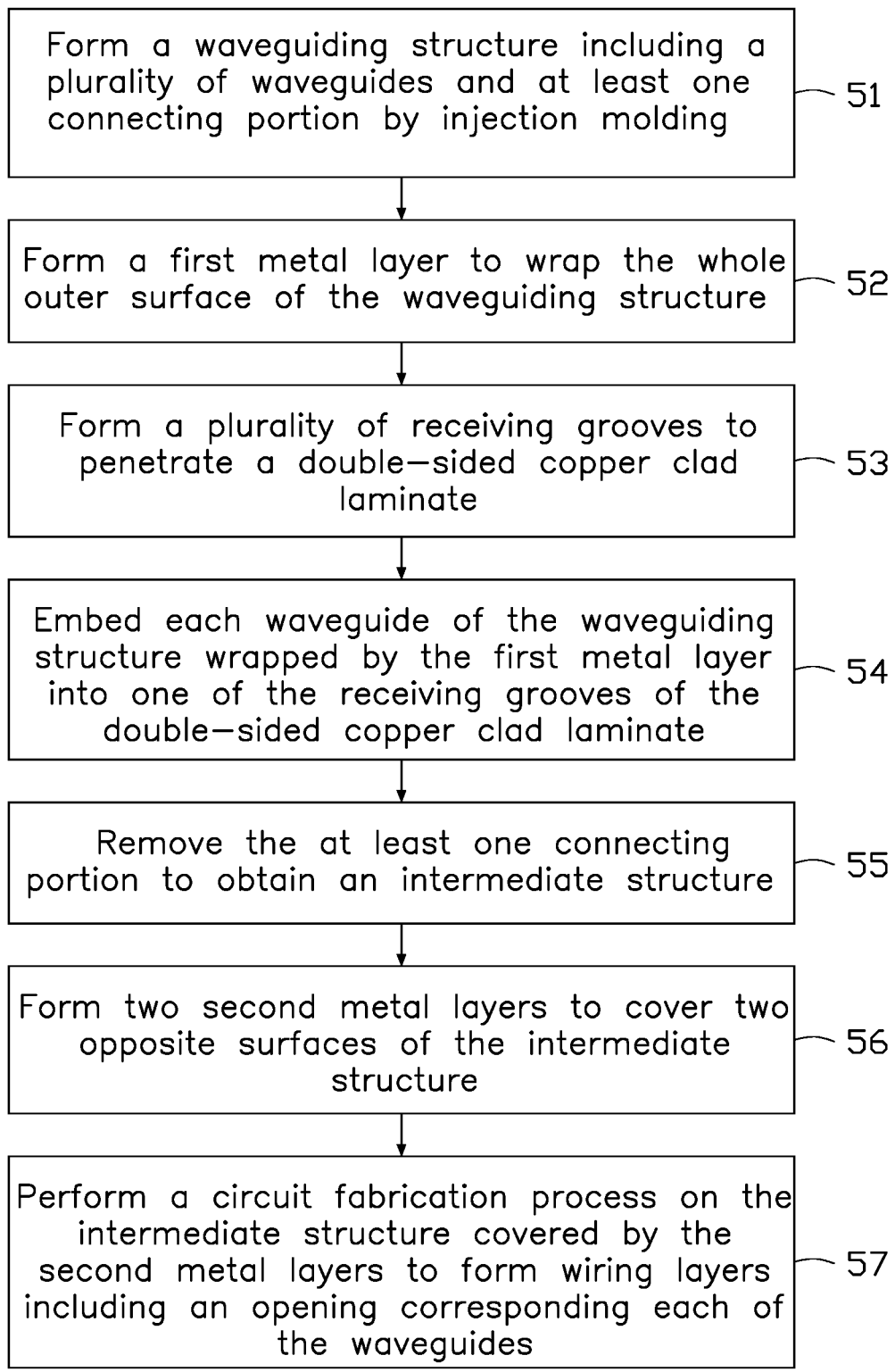
FIG. 1 is a flowchart of a first embodiment of a method for manufacturing a circuit board having waveguides according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1 illustrates a flowchart of a method in accordance with a first embodiment. The first embodiment method for manufacturing a circuit board having waveguides is provided by way of embodiments, as there are a variety of ways to carry out the method. Each block shown in FIG. 1 represents one or more processes, methods, or subroutines carried out in the method. Furthermore, the illustrated order of blocks can be changed. Additional blocks may be added or fewer blocks may be utilized, without departing from this disclosure. The first embodiment method can begin at block 51.

Figure 2:
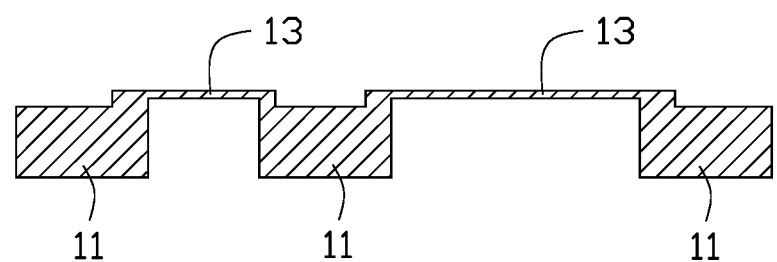
FIG. 2 is a cross-sectional view of an embodiment of a waveguiding structure including waveguides and at least one connecting portion according to the present disclosure.

At block 51, referring to FIG. 2, a waveguiding structure 10 made of a thermoplastic polymer material is formed by injection molding. The waveguiding structure 10 includes a plurality of waveguides 11 arranged at intervals and at least one connecting portion 13 connecting two adjacent waveguides 11.

The thermoplastic polymer material is preferably a material with high temperature resistance, low dielectric loss and low thermal expansion coefficient. In at least one embodiment, the thermoplastic polymer material may be, but is not limited to, polyolefin.

The waveguiding structure 10 is formed by injection molding, which facilitates the integration of the waveguides 11 and the connecting portion 13, and at the same time, it is also beneficial to obtain a waveguiding structure 10 with a smooth surface, an accurate size, and an accurate shape. The smooth surface of the waveguides 11 is beneficial to reduce the loss of microwave signal transmission.

In at least one embodiment, the waveguiding structure 10 may include three spaced waveguides 11 and two connecting portions 13.

The waveguides 11 are arranged at intervals along a first direction. Two opposite ends of each connecting portion 13 are respectively connected to two adjacent waveguides 11, and the connecting portions 13 are located on the same side of any two waveguides 11.

Figure 3:
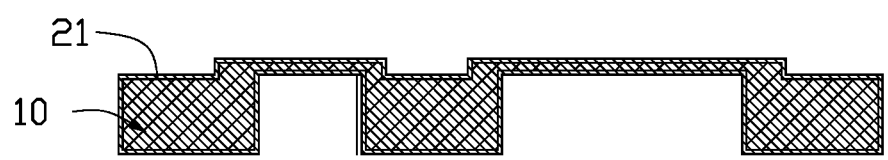
FIG. 3 is a cross-sectional view showing a first metal layer on the waveguiding structure of FIG. 2.

At block 52, referring to FIG. 3, a first metal layer 21 is formed on the waveguiding structure 10 to wrap the whole outer surface of the waveguiding structure 10.

The first metal layer 21 may include copper, gold, or silver. The first metal layer 21 may be formed by electroplating, chemical vapor deposition, or printing.

Figure 4:
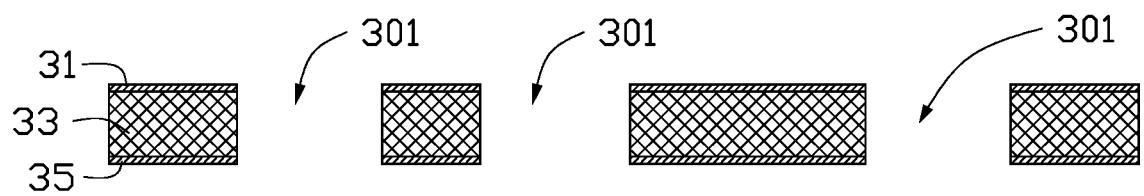
FIG. 4 is a cross-sectional view of an embodiment wherein a double-sided copper clad is laminated with a plurality of receiving grooves.

At block 53, referring to FIG. 4, a double-sided copper clad laminate 30 is provided, and a plurality of receiving grooves 301 penetrates the double-sided copper clad laminate 30. The plurality of receiving grooves 301 corresponds to the plurality of waveguides 11 of the waveguiding structure 10.

In at least one embodiment, three receiving grooves 301 are arranged at intervals on the double-sided copper clad laminate 30. Each receiving groove 301 may be formed by stamping, laser cutting or etching.

Specifically, the double-sided copper clad laminate 30 may include a base copper layer 31, an insulating layer 33, and another base copper layer 35 stacked in that sequence along a stacking direction. Each receiving groove 301 penetrates the base copper layer 31, the insulating layer 33, and the base copper layer 35 along the above stacking direction.

Figure 5:
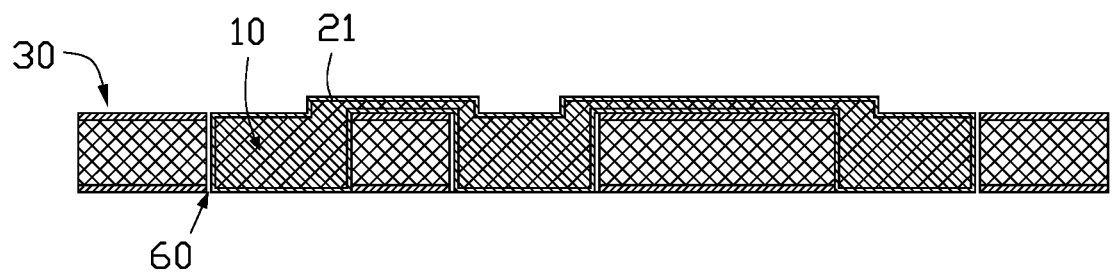
FIG. 5 is a cross-sectional view showing the waveguiding structure of FIG. 3 embedded in the plurality of receiving grooves of FIG. 4.

At block 54, referring to FIG. 5, the waveguides 11 of the waveguiding structure 10 wrapped by the first metal layer 21 are embedded in the receiving grooves 301 of the double-sided copper clad laminate 30. The at least one connecting portion 13 is located on one side of the double-sided copper clad laminate 30.

In at least one embodiment, along the stacking direction, a thickness of each of the waveguides 11 provided with the first metal layer 21 may be substantially equal to a thickness of the double-sided copper clad laminate 30.

In at least one embodiment, a gap 60 may be formed between each waveguide 11 and the double-sided copper clad laminate 30.

Figure 6:
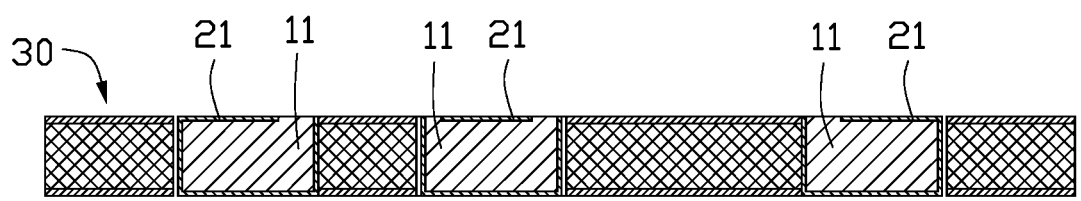
FIG. 6 is a cross-sectional view showing an intermediate structure wherein the at least one connecting portion is removed from the waveguides of FIG. 5.

At block 55, referring to FIG. 6, the at least one connecting portion 13 located on one side of the double-sided copper clad laminate 30 is removed to obtain an intermediate structure 40. The intermediate structure 40 includes the double-sided copper clad laminate 30 and the waveguides 11 provided with the first metal layer 21 embedded in the double-sided copper clad laminate 30.

In at least one embodiment, the at least one connecting portion 13 may be removed by mechanical cutting or laser cutting.

Figure 7:
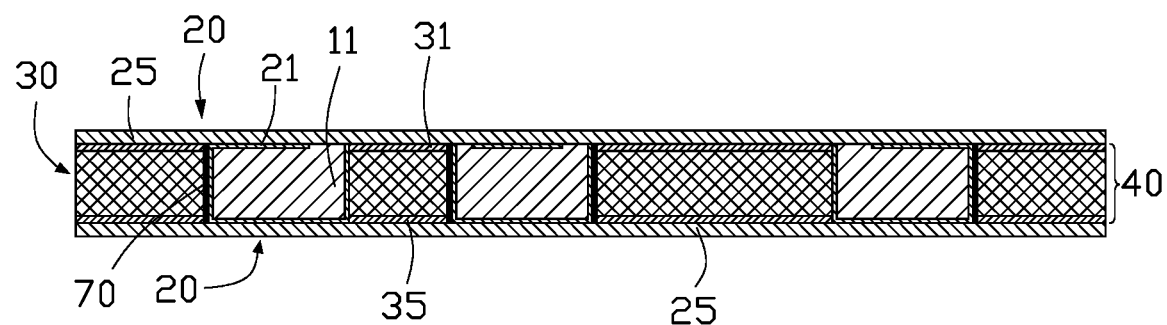
FIG. 7 is a cross-sectional view showing second metal layers on the intermediate structure of FIG. 6.

At block 56, referring to FIG. 7, the gap 60 is filled with a resin 70, and two opposite surfaces of the intermediate structure 40 spaced along the stacking direction are respectively covered by a second metal layer 25. The base copper layers (31 and 35), two second metal layers 25, and two portions of the first metal layer 21 on two surfaces of the waveguides 11 spaced along the stacking direction constitute two conductive layers 20 formed on the opposite surfaces of the intermediate structure 40 respectively.

In at least one embodiment, the second metal layers 25 may be formed by electroplating.

Figure 8:
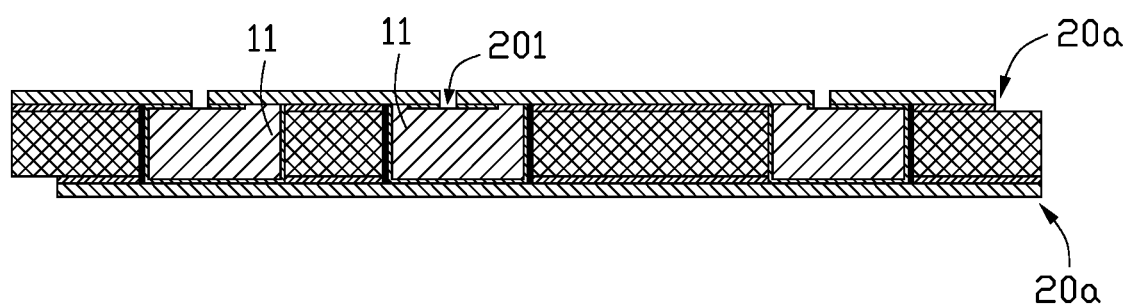
FIG. 8 is a cross-sectional view of an embodiment of a circuit board having waveguides according to the present disclosure.
Figure 9:
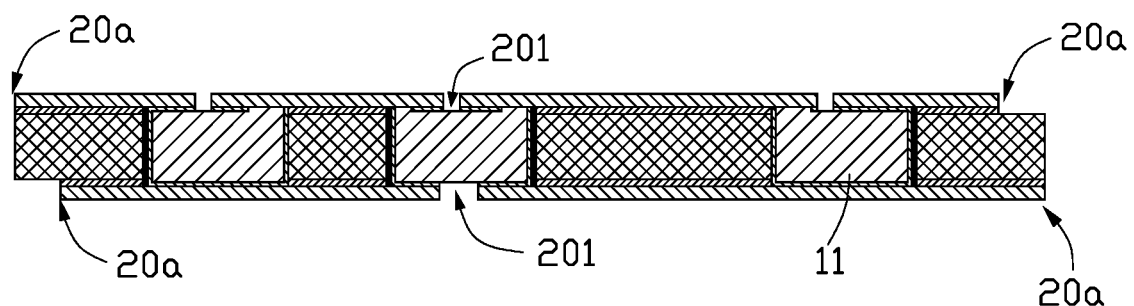
FIG. 9 is a cross-sectional view of another embodiment of a circuit board having waveguides according to the present disclosure.

At block 57, referring to FIG. 8 and FIG. 9, two wiring layers 20a are formed by performing a circuit fabrication process on the conductive layers 20. As shown in FIG. 8, an opening 201 corresponding to each waveguide 11 is formed on the wiring layers 20a to expose the waveguide 11 as a wave inlet or a wave outlet.

Figure 10:
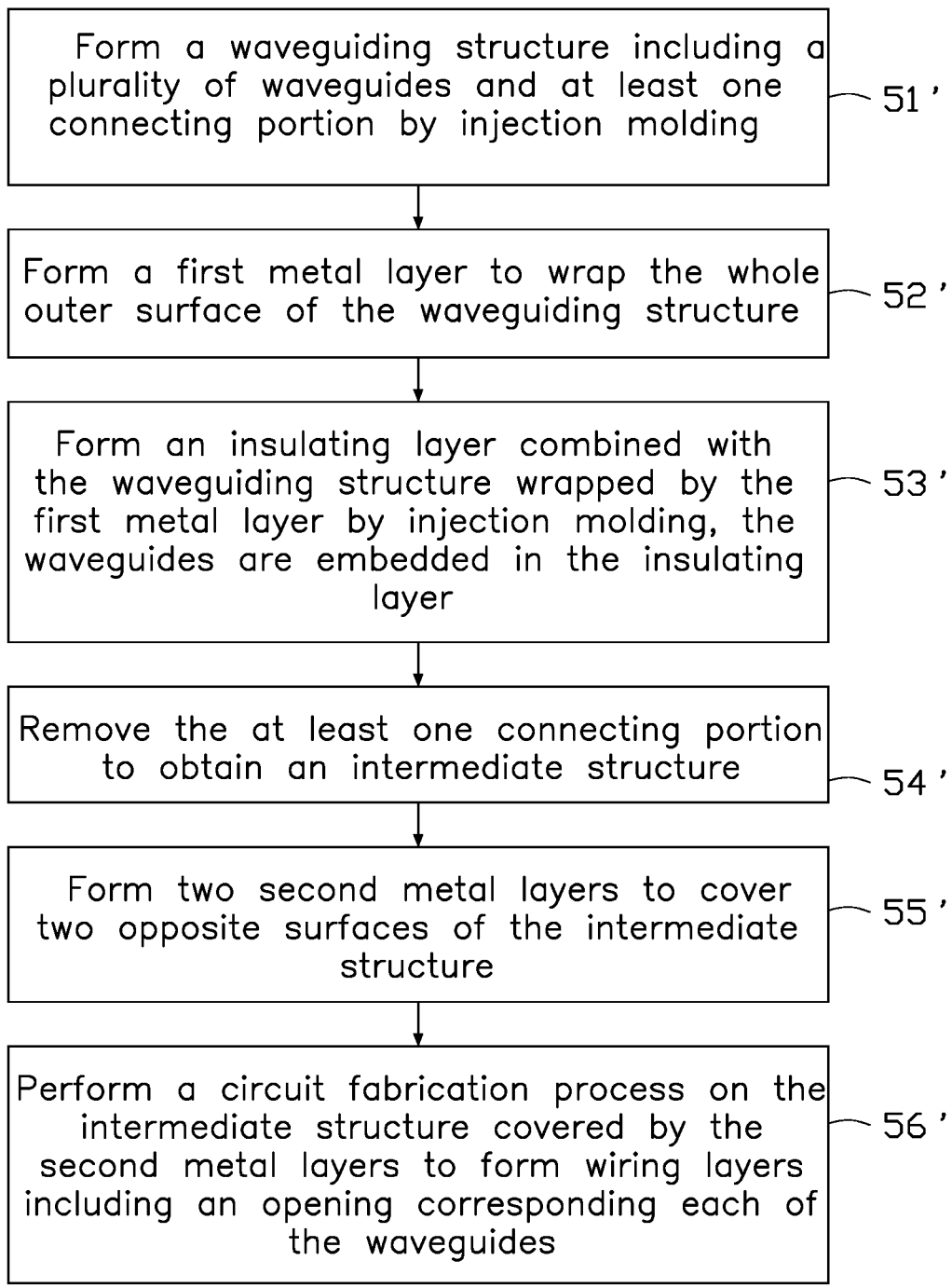
FIG. 10 is a flowchart of a second embodiment of a method of manufacturing a circuit board having waveguides according to the present disclosure.

FIG. 10 illustrates a flowchart of a second embodiment of a method of manufacturing the circuit board having waveguides. Different from the above first embodiment, the block 53 to block 56 are replaced with the block 53', the block 54', and the block 55'. The block 51', the block 52' and the block 56' are respectively the same with the block 51, the block 52 and the block 57.

Figure 11:
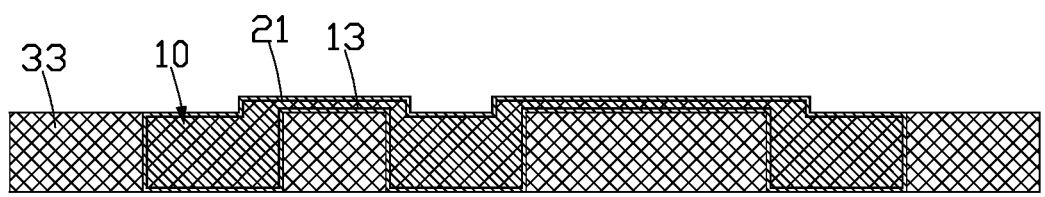
FIG. 11 is a cross-sectional view showing an insulating layer on the waveguiding structure of FIG. 3.

At block 53', referring to FIG. 11, an insulating layer 33 is formed directly on the waveguiding structure 10 wrapped by the first metal layer 21 by injection molding, and the insulating layer 33 is embedded in the waveguiding structure 10. The at least one connecting portion 13 is located on one side of the insulating layer 33.

In at least one embodiment, along a thickness direction perpendicular to the first direction, a thickness of the insulating layer 33 may be substantially equal to a thickness of each of the waveguides 11 provided with the first metal layer 21.

A melting point of the insulating layer 33 is preferably lower than a melting point of the waveguiding structure 10, thereby preventing the formation of the insulating layer 33 from affecting the waveguiding structure 10, for example: too high temperature causes the structure and the size of the waveguiding structure 10 to change.

Since the insulating layer 33 is directly formed by injection molding on the waveguiding structure 10 wrapped by the first metal layer 21, the gap between the insulating layer 33 and each waveguide 11 is avoided, and an overall structure formed by the insulating layer 33 and the waveguiding structure 10 is more stable.

Figure 12:
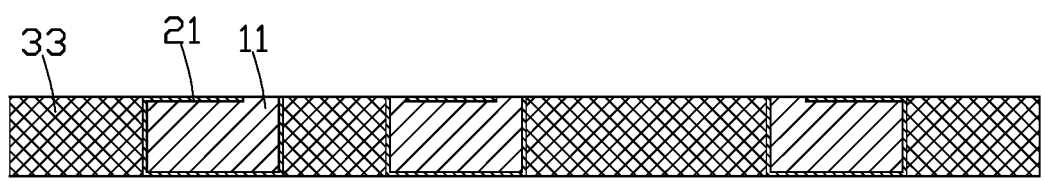
FIG. 12 is a cross-sectional view showing an intermediate structure wherein the at least one connecting portion is removed from the waveguides of FIG. 11.

At block 54', referring to FIG. 12, the at least one connecting portion 13 on one side of the insulating layer 33 is removed to obtain an intermediate structure 40a. The intermediate structure 40a includes the insulating layer 33 and the waveguides 11 provided with the first metal layer 21 embedded in the insulating layer 33.

In at least one embodiment, the at least one connecting portion 13 may be removed by mechanical cutting or laser cutting.

Figure 13:
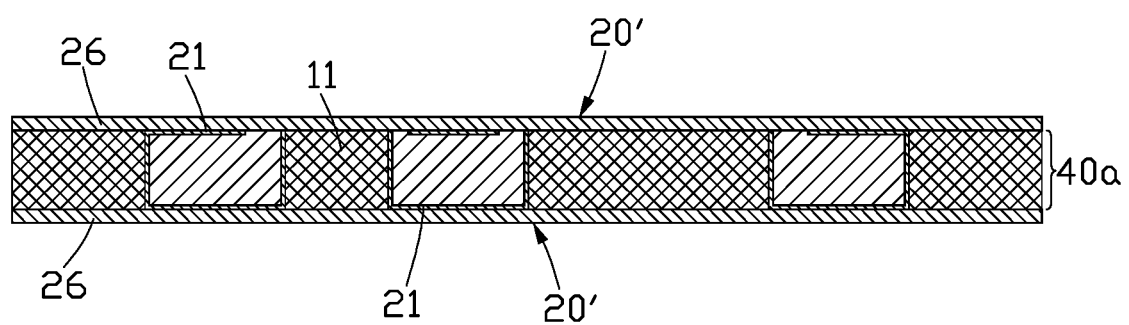
FIG. 13 is a cross-sectional view showing second metal layers on the intermediate structure of FIG. 12.

At block 55', referring to FIG. 13, two opposite surfaces of the intermediate structure 40 spaced along the thickness direction are respectively covered by a second metal layer 26. Two second metal layers 26 and two portions of the first metal layer 21 on two surfaces of the waveguides 11 spaced along the thickness direction constitute two conductive layers 20' formed on the opposite surfaces of the intermediate structure 40' respectively.

In at least one embodiment, the second metal layers 26 may be formed by electroplating.

Figure 15:
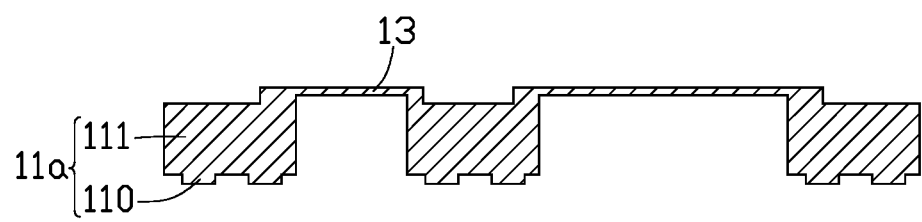
FIG. 15 is a cross-sectional view of another embodiment of a waveguiding structure including waveguides and at least one connecting portion according to the present disclosure.

In at least one embodiment, referring to FIG. 15, each waveguide 10 may include a waveguiding substrate 111 and at least one protrusion 110 on the waveguiding substrate 111. Each protrusion 110 corresponds to one opening 201 (shown in FIG. 9) as a wave inlet or a wave outlet. The waveguiding substrate 111 includes two opposite surfaces 111a and 111b spaced along the thickness direction or the stacking direction. The at least one protrusion 110 protrudes from one of the opposite surfaces of the waveguiding substrate 111.

In the above-mentioned method of manufacturing the circuit board having waveguides, the waveguiding structure 10 is formed by injection molding, which is conducive to the integration of the waveguides 11 and the connecting portion 13, and is also conducive to obtain the waveguiding structure 10 with a smooth surface, an accurate size, and an accurate shape. The first metal layer 21 wraps the waveguiding structure 10 avoids the opening of metal through vias in the prior art, reduces the requirements for process accuracy and process cost, and also improves the product yield.

Figure 14:
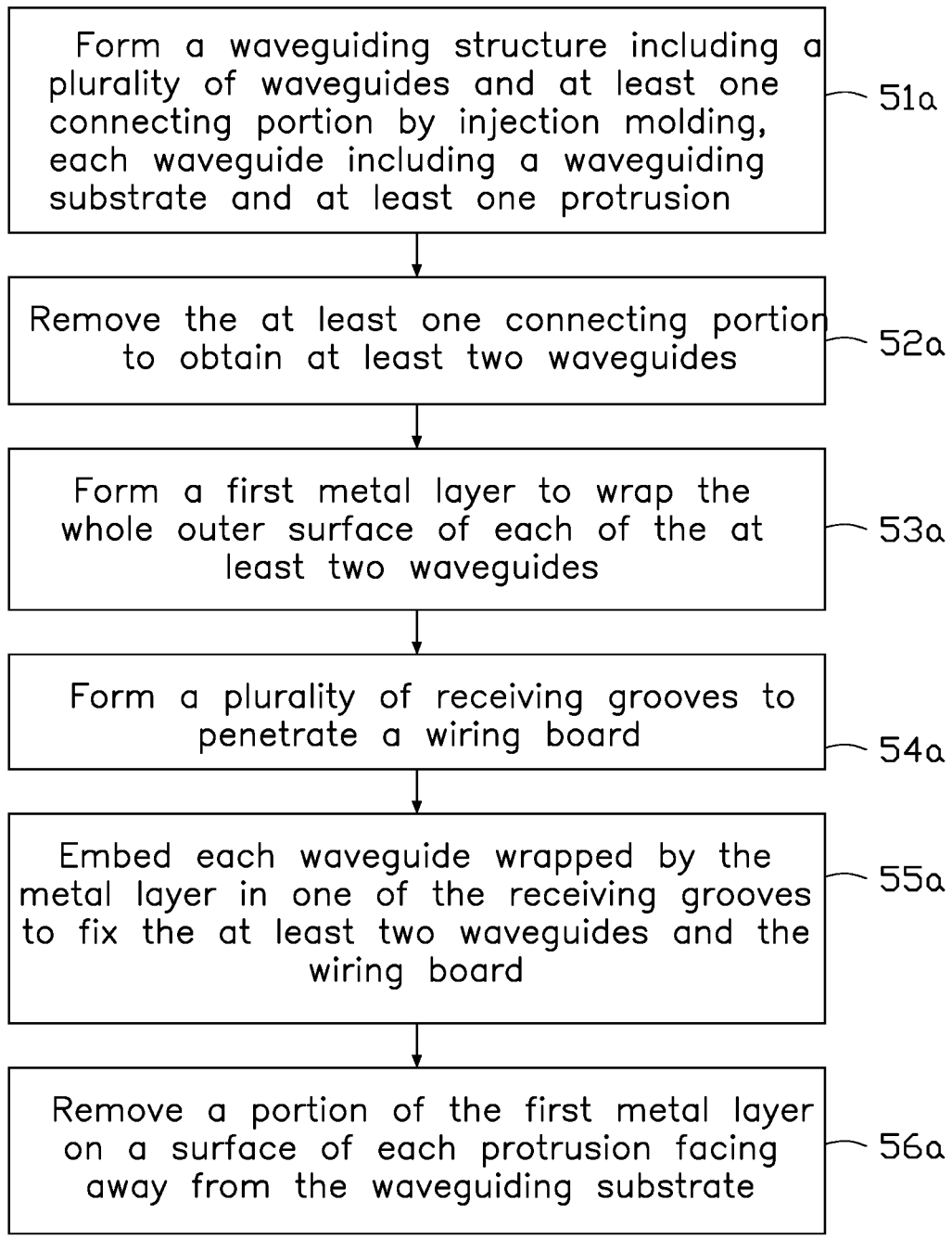
FIG. 14 is a flowchart of a third embodiment of a method of manufacturing a circuit board having waveguides according to the present disclosure.

FIG. 14 illustrates a flowchart of a third embodiment of a method of manufacturing the circuit board having waveguides. The method can begin at block 51a.

At block 51a, referring to FIG. 15, a waveguiding structure 10a made of a thermoplastic polymer material is formed by injection molding. The waveguiding structure 10a includes a plurality of waveguides 11a arranged at intervals and at least one connecting portion 13 connecting two adjacent waveguides 11a. Each of the plurality of waveguides 11 includes a waveguiding substrate 111 and at least one protrusion 110 on the waveguiding substrate 111 as a wave inlet or a wave outlet.

In at least one embodiment, each connecting portion 13 may be connected to the waveguiding substrate 111.

In at least one embodiment, the at least one connecting portion 13 and the at least one protrusion 110 may be located the same side of the waveguiding substrates 111. In another embodiment, the at least one connecting portion 13 and the at least one protrusion 110 may be located two opposite sides of the waveguiding substrates 111.

Figure 16:
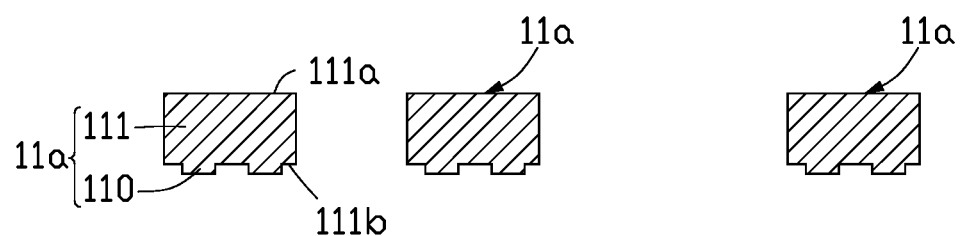
FIG. 16 is a cross-sectional view of an embodiment of waveguides according to the present disclosure.

At block 52a, referring to FIG. 16, the at least one connecting portion 13 is removed to obtain at least two waveguides 11a.

Figure 17:
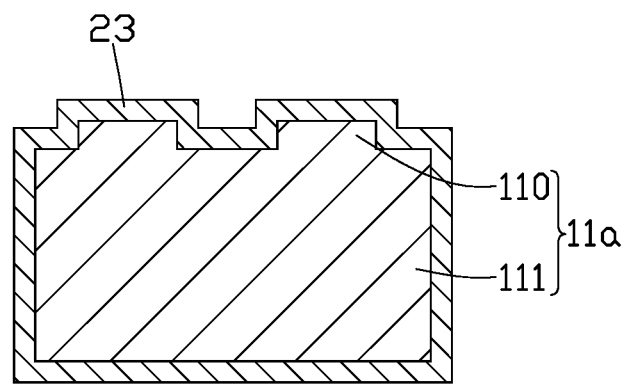
FIG. 17 is a cross-sectional view showing a first metal layer on the waveguide of FIG. 16.

At block 53a, referring to FIG. 17, a first metal layer 23 is formed on each of the at least two waveguides 11a to wrap the whole outer surface of each of the at least two waveguides 11a.

Figure 18:
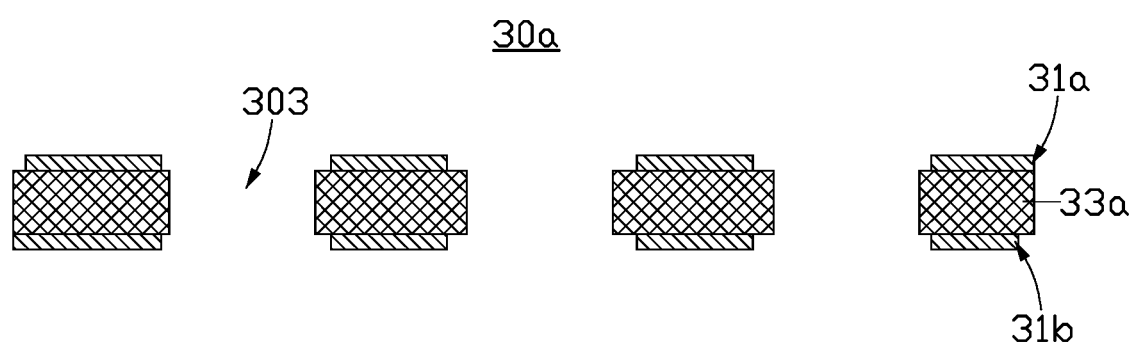
FIG. 18 is a cross-sectional view of an embodiment of a wiring board with a plurality of receiving grooves according to the present disclosure.

At block 54a, referring to FIG. 18, a wiring board 30a is provided, and a plurality of receiving grooves 303 penetrates the wiring board 30a.

The wiring board 30a may be a double-layer wiring board or a multilayer wiring board. In at least one embodiment, the wiring board 30a is a double-layer wiring board and includes a first wiring layer 31a, an insulating layer 33a, and a second wiring layer 31b stacked in that sequence along a stacking direction. Each receiving groove 303 penetrates the wiring board 30a along the stacking direction.

Figure 19:
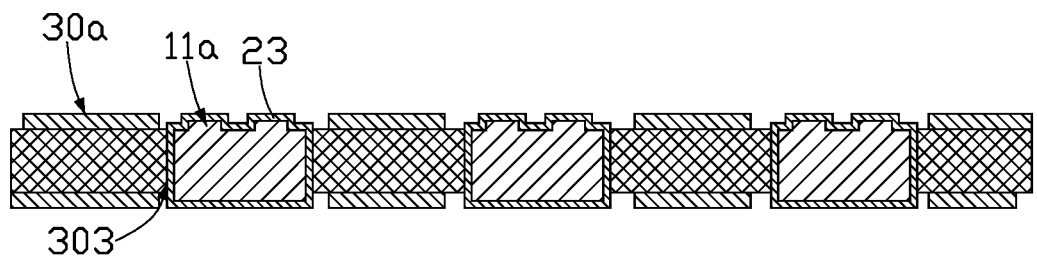
FIG. 19 is a cross-sectional view showing the waveguides of FIG. 17 embedded in the receiving grooves of FIG. 18.

At block 55a, referring to FIG. 19, each of the at least two waveguides 11a wrapped by the first metal layer 23 is embedded in one of the plurality of receiving grooves 303, and the at least two waveguides 11a and the wiring board 30a are fixed.

In at least one embodiment, along the stacking direction, a thickness of each of the at least two waveguides 11 may be substantially equal to a thickness of wiring board 30a.

Figure 20:
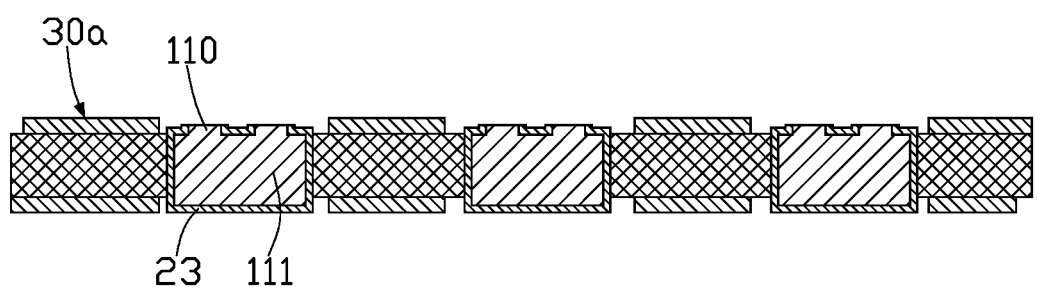
FIG. 20 is a cross-sectional view of a third embodiment of a circuit board having waveguides according to the present disclosure.

At block 56a, referring to FIG. 20, a portion of the first metal layer 23 on a surface of each of the at least one protrusion 110 facing away from the waveguiding substrate 111 is removed.

In at least one embodiment, the portion of the first metal layer 23 the surface of each of the at least one protrusion 110 facing away from the waveguiding substrate 111 may be removed by polishing.

In the above-mentioned method of manufacturing the circuit board having waveguides, the waveguiding structure 10a is formed by injection molding, which is conducive to obtain the waveguides 11a with a smooth surface, an accurate size, and an accurate shape. So that the loss of microwave signals transmission may be reduced. The first metal layer 23 wraps the waveguides 11a avoids the opening of metal through vias in the prior art, reduces the requirements for process accuracy and process cost, and also improves the product yield.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method of manufacturing a circuit board having waveguides comprising:
    forming a waveguiding structure by injection molding, wherein the waveguiding structure comprises a plurality of waveguides arranged at intervals along a first direction and at least one connecting portion connecting two adjacent waveguides;
    forming a first metal layer to wrap the whole outer surface of the waveguiding structure;
    forming a plurality of receiving grooves to penetrate a double-sided copper clad laminate;
    embedding each of the plurality of waveguides of the waveguiding structure wrapped by the first metal layer into one of the plurality of receiving grooves of the double-sided copper clad laminate, wherein the at least one connecting portion is located on one side of the double-sided copper clad laminate;
    removing the at least one connecting portion to obtain an intermediate structure, wherein the intermediate structure comprises the double-sided copper clad laminate and the plurality of waveguides with the first metal layer embedded into the double-sided copper clad laminate;
    forming two second metal layers to cover two opposite surfaces of the intermediate structure spaced along a thickness direction perpendicular to the first direction respectively; and
    performing a circuit fabrication process on the intermediate structure covered by the second metal layers to form wiring layers, wherein the wiring layers comprises an opening corresponding to each of the plurality of waveguides.

2. The method of claim 1, wherein a gap is formed between each of the plurality of waveguides and the double-sided copper clad laminate, before forming the second metal layers, the method further comprises:
filling each gap with a resin.

3. The method of claim 1, wherein a thickness of each of the waveguides provided with the first metal layer along the thickness direction is equal to a thickness of the double-sided copper clad laminate along the thickness direction.

4. The method of claim 1, wherein each of the plurality of waveguides comprises a waveguiding substrate and at least one protrusion, the waveguiding substrate comprises two opposite surfaces spaced along the thickness direction, the at least one protrusion protrudes from one of the opposite surfaces of the waveguiding substrate; the at least one protrusion is exposed from the opening.

5. A circuit board having waveguides is made by the method of claim 1.

6. A method of manufacturing a circuit board having waveguides comprising:
forming a waveguiding structure by injection molding, wherein the waveguiding structure comprises a plurality of waveguides arranged at intervals along a first direction and at least one connecting portion connecting two adjacent waveguides;
forming a first metal layer to wrap the whole outer surface of the waveguiding structure;
forming an insulating layer combined with the waveguiding structure wrapped by the first metal layer by injection molding, wherein the plurality of waveguides is embedded in the insulating layer, the at least one connecting portion is located on one side of the insulating layer;
removing the at least one connecting portion to obtain an intermediate structure, wherein the intermediate structure comprises the insulating layer and plurality of waveguides with the first metal layer embedded in the insulating layer;
forming two second metal layers to cover two opposite surfaces of the intermediate structure spaced along a thickness direction perpendicular to the first direction respectively; and
performing a circuit fabrication process on the intermediate structure covered by the second metal layers to form wiring layers, wherein the wiring layers comprises an opening corresponding to each of the plurality of waveguides.

7. The method of claim 6, wherein a melting point of the insulating layer is lower than a melting point of the waveguiding structure.

8. The method of claim 6, wherein a thickness of each of the waveguides provided with the first metal layer along the thickness direction is equal to a thickness of the insulating layer along the thickness direction.

9. The method of claim 6, wherein each of the plurality of waveguides comprises a waveguiding substrate and at least one protrusion, the waveguiding substrate comprises two opposite surfaces spaced along the thickness direction, the at least one protrusion protrudes from one of the opposite surfaces of the waveguiding substrate; the at least one protrusion is exposed from the opening.

10. A circuit board having waveguides is made by the method of claim 6.

11. A method of manufacturing a circuit board having waveguides comprising:
forming a waveguiding structure by injection molding, wherein the waveguiding structure comprises a plurality of waveguides arranged at intervals and at least one connecting portion connecting two adjacent waveguides, each of the plurality of waveguides comprises a waveguiding substrate and at least one protrusion on the waveguiding substrate;
removing the at least one connecting portion to obtain at least two waveguides;
forming a metal layer to wrap the whole outer surface of each of the at least two waveguides;
forming a plurality of receiving grooves to penetrate a wiring board along a thickness direction;
embedding each of the at least two waveguides wrapped by the metal layer in one of the plurality of receiving grooves, wherein the at least two waveguides and the wiring board are fixed; and
removing a portion of the metal layer on a surface of each of the at least one protrusion facing away from the waveguiding substrate.

12. The method of claim 11, wherein a thickness of each of the at least two waveguides along the thickness direction is equal to a thickness of wiring board along the thickness direction.

13. The method of claim 11, wherein the portion of the metal layer on a surface of each of the at least one protrusion facing away from the waveguiding substrate is removed by polishing.

14. A circuit board having waveguides is made by the method of claim 11.

* * * * *